(12) United States Patent
Houssameddine et al.

(10) Patent No.: US 10,439,129 B2
(45) Date of Patent: Oct. 8, 2019

(54) SHIELDED MRAM CELL (71) Applicant: GLOBALFOUNDRIES Singapore Pte Ltd, Singapore (SG)

(72) Inventors: Dimitri Houssameddine, Singapore (SG); Chenchen Jacob Wang, Singapore (SG); Bin Liu, Singapore (SG); Soh Yun Siah, Singapore (SG)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/874,077

(22) Filed: Jan. 18, 2018

(65) Prior Publication Data

US 2019/0221732 A1 Jul. 18, 2019

(51) Int. Cl.
*H01L 43/02* (2006.01)
*H01L 23/552* (2006.01)
*H01L 27/22* (2006.01)

(52) U.S. Cl.
CPC ............ *H01L 43/02* (2013.01); *H01L 23/552* (2013.01); *H01L 27/222* (2013.01)

(58) Field of Classification Search
None
See application file for complete search history.

(56) References Cited

U.S. PATENT DOCUMENTS

| | | |
|---|---|---|
| 6,143,632 A | 11/2000 | Ishida et al. |
| 6,151,241 A | 11/2000 | Hayashi et al. |
| 6,218,245 B1 | 4/2001 | Xiang et al. |
| 6,613,586 B2 | 9/2003 | Bailey |
| 6,833,306 B2 | 12/2004 | Lyding et al. |
| 6,975,019 B2 | 12/2005 | Hazama |
| 7,125,768 B2 | 10/2006 | Reinberg |
| 7,545,662 B2 | 6/2009 | Wang et al. |
| 8,536,683 B2 | 9/2013 | Barth et al. |
| 8,993,400 B1 | 3/2015 | Ramkumar et al. |
| 9,136,464 B1 | 9/2015 | Whig et al. |
| 9,293,182 B2 | 3/2016 | Houssameddine |
| 9,419,208 B2 | 8/2016 | Whig |
| 9,548,095 B2 | 1/2017 | Houssameddine et al. |

(Continued)

FOREIGN PATENT DOCUMENTS

| | | |
|---|---|---|
| WO | 2016/064514 A1 | 4/2016 |
| WO | 2017/111826 A1 | 6/2017 |

OTHER PUBLICATIONS

Office Action from related U.S. Appl. No. 15/874,205 dated Nov. 30, 2018.

*Primary Examiner* — Asok K Sarkar
(74) *Attorney, Agent, or Firm* — Amerson Law Firm, PLLC (57) ABSTRACT

One illustrative integrated circuit (IC) product disclosed herein includes an MRAM cell, the MRAM cell having an outer perimeter, wherein the MRAM cell comprises a bottom electrode, a top electrode and an MTJ (Magnetic Tunnel Junction) element positioned above the bottom electrode and below the top electrode. In this example, the IC product also includes an insulating material positioned around the outer perimeter of the MRAM cell and a conductive sidewall spacer comprised of a metal-containing shielding material positioned around the outer perimeter of the MRAM cell, wherein the insulating material is positioned between the conductive sidewall spacer and the MRAM cell.

17 Claims, 11 Drawing Sheets

(56) References Cited

U.S. PATENT DOCUMENTS

| | | | |
|---|---|---|---|
| 9,646,850 B2 | 5/2017 | Pethe et al. | |
| 2002/0175358 A1 | 11/2002 | Yamamichi | |
| 2005/0009210 A1 | 1/2005 | Hosotani | |
| 2010/0072566 A1* | 3/2010 | Kang | H01L 43/08 257/422 |
| 2013/0119496 A1* | 5/2013 | Zeng | H01L 43/02 257/421 |
| 2016/0196951 A1* | 7/2016 | Ohsawa | H01J 37/30 250/492.3 |
| 2016/0351792 A1* | 12/2016 | Jiang | H01L 43/02 |
| 2018/0277750 A1* | 9/2018 | Kim | G11C 11/161 |
| 2019/0088863 A1* | 3/2019 | Lu | H01L 43/12 |

\* cited by examiner

SHIELDED MRAM CELL

BACKGROUND OF THE INVENTION

1. Field of the Invention

The present disclosure generally relates to the fabrication of integrated circuits, and, more particularly, to various novel embodiments of a shielded MRAM (Magnetic Random Access Memory) cell and various novel methods of makings such shielded MRAM cells.

2. Description of the Related Art

Memory arrays based upon MRAM cells have drawn greater interest in recent years given that they combine high processing speeds, can be accessed like other random access memory devices and because they exhibit the nonvolatility of random access memory devices. Each MRAM cell includes a top electrode, a bottom electrode and an MTJ (Magnetic Tunnel Junction) element positioned between the top and bottom electrodes. The MTJ element may be comprised of a variety of different materials, e.g., a first pinned ferromagnetic material layer, a tunnel barrier layer and a second free ferromagnetic material layer. Each MRAM cell is operatively coupled to a read switching element that is formed in a semiconductor substrate.

In modern IC products, embedded MRAM arrays are formed on a common semiconductor substrate at the same time other CMOS-based transistor devices are being formed on the substrate for other non-memory circuits, e.g., logic circuits. The performance and stability of the CMOS-based transistors may be enhanced by being subjected to a relatively high temperature/high pressure anneal process (in, for example, an ambient comprising hydrogen and deuterium) so as to passivate dangling silicon bonds in the channel and/or source/drain regions of the transistor devices. However, the anneal process damages several magnetic properties of the MRAM cells, which is detrimental to the performance of the MRAM cells and memory arrays incorporating such MRAM cells.

The present disclosure is directed to various novel embodiments of a shielded MRAM cell and various novel methods of makings such shielded MRAM cells.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a shielded MRAM cell and various novel methods of making such shielded MRAM cells. One illustrative integrated circuit (IC) product disclosed herein includes an MRAM cell, the MRAM cell having an outer perimeter, wherein the MRAM cell comprises a bottom electrode, a top electrode and an MTJ (Magnetic Tunnel Junction) element positioned above the bottom electrode and below the top electrode. In this example, the IC product also includes an insulating material positioned around the outer perimeter of the MRAM cell and a metal-containing sidewall spacer comprised of a metal-containing shielding material positioned around the outer perimeter of the MRAM cell, wherein the insulating material is positioned between the metal-containing sidewall spacer and the MRAM cell.

Another illustrative integrated circuit (IC) product disclosed herein includes an MRAM cell wherein the MRAM cell comprises a bottom electrode, a top electrode and an MTJ (Magnetic Tunnel Junction) element positioned above the bottom electrode and below the top electrode. In this example, the product also includes a first insulating material positioned around the outer perimeter of the MRAM cell and a second insulating material positioned on the first insulating material and around the outer perimeter of the MRAM cell, wherein the first insulating material and the second insulating material are different materials.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel embodiments of a shielded MRAM (Magnetic Random Access Memory) cell and various novel methods of making such shielded MRAM cells. As will be readily apparent to those skilled in the art upon a complete reading of the present application, the present method may be employed in manufacturing MRAM cells and arrays in a variety of different integrated circuit (IC) products 10. With reference to the attached figures, various illustrative embodiments of the methods and devices disclosed herein will now be described in more detail. The various components and structures of the devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 1:
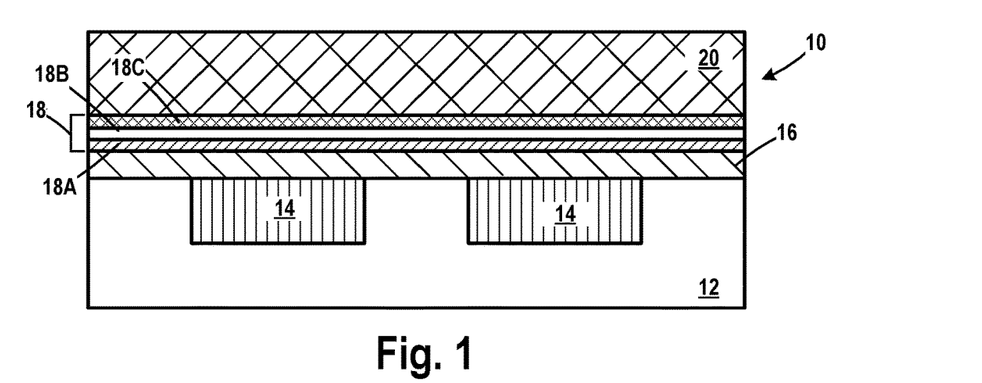
FIGS. 1-9 depict various novel embodiments of a shielded MRAM cell and various novel methods of makings such shielded MRAM cells.

FIGS. 1-9 depict various novel embodiments of a shielded MRAM cell and various novel methods of making such shielded MRAM cells, wherein FIG. 1 depicts an IC product 10 that will comprises the novel shielded MRAM cells disclosed herein. The IC product 10 will be formed in and above a semiconductor substrate (not shown). The substrate may have a variety of configurations, such as a bulk substrate configuration or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

Prior to performing the processing operations shown in FIG. 1, various transistor devices (not shown in FIG. 1), as well as various conductive contact structures (not shown in FIG. 1) that are coupled to those transistor devices, were formed in and above the semiconductor substrate. For example, at this point in the process flow, a transistor (not shown) that functions as a read switching element for the MRAM cell, as well as other CMOS-based transistors (not shown) for other non-memory circuits (such as peripheral logic circuits), would have been formed for the product 10 using traditional manufacturing techniques. FIG. 1 depicts the product 10 after a layer of insulating material 12 (e.g., silicon dioxide, a low-k (k value less than 3.3)) was formed above the substrate. Also depicted in FIG. 1 is a plurality of conductive structures 14, (e.g., conductive vias) that were formed in the layer of insulating material 12. The conductive structures 14 may be comprised of any conductive material, they may be of any desired configuration, and they may be manufactured using any of a variety of different manufacturing techniques (e.g., single or dual damascene). As will be appreciated by those skilled in the art after a complete reading of the present application, each of the conductive structures 14 will be conductively coupled to a bottom electrode of a novel shielded MRAM cell disclosed herein.

Still referencing FIG. 1, various layers of material are sequentially blanket-deposited above the layer of insulating material 12. More specifically, a layer of bottom electrode material 16, a plurality of layers 18A-C for an MTJ (Magnetic Tunnel Junction) element 18, and a layer of top electrode material 20 were sequentially deposited above the layer of insulating material 12. The layer of bottom electrode material 16 may be formed to any desired thickness and it may be formed of any conductive material, e.g., a metal-containing material, a metal compound, etc. In one illustrative embodiment, the layer of bottom electrode material 16 may be comprised of tantalum nitride. The layer of top electrode material 20 may be formed to any desired thickness and it may be formed of any conductive material, e.g., a metal-containing material, a metal compound, etc. In one illustrative embodiment, the layer of top electrode material 20 may be comprised of tantalum nitride. The bottom and top layers of electrode material 16, 20 need not be formed of the same conductive material (nor the same thickness), but that situation may occur in some applications. The MTJ element 18 depicted herein is intended to be representative of any type of MTJ element 18 formed for MRAM cells. The MTJ element 18 depicted herein may be comprised of a variety of different materials, with a variety of different thicknesses, that are arranged in a variety of different configurations. In one illustrative embodiment, the MTJ element 18 may be comprised of a first pinned ferromagnetic material layer 18A (e.g., a Co/Pt or Co/Ni multi-layer, a CoFeB alloy), a tunnel barrier layer 18B (e.g., MgO or $Al_2O_3$) and a second free ferromagnetic material layer 18C (e.g., a CoFeB-based alloy).

Figure 2:
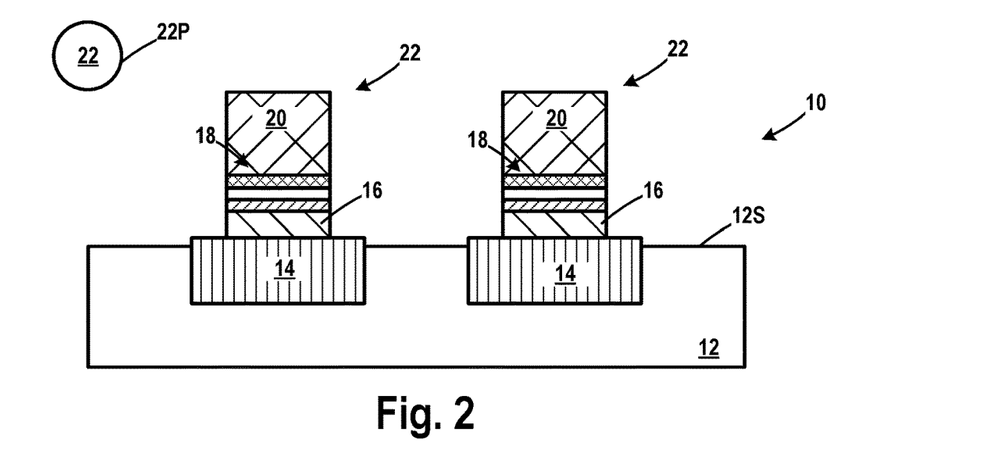

FIG. 2 depicts the product 10 after one or more etching processes, e.g., anisotropic etching processes, were performed through a patterned etch mask (not shown) to etch exposed portions of the layers 16, 18A, 18B, 18C and 20 so as to result in the formation of a plurality of MRAM cells 22 (or pillars). There may be some pull-down of the upper surface 12S of the layer of insulating material 12 during this etching process, as reflected in FIG. 2. The patterned etch mask may be a patterned layer of photoresist or it may be a patterned hard mask layer comprised of one or more layers of material, e.g., a patterned layer of silicon nitride. The MRAM cells 22 may have a variety of different configurations or shapes when viewed from above. In the examples depicted herein, the MRAM cells 22 will be patterned so as to have a substantially circular configuration when viewed from above, as indicated in the upper left portion of FIG. 2. The MRAM cells 22 have an outer perimeter 22P.

Figure 3:
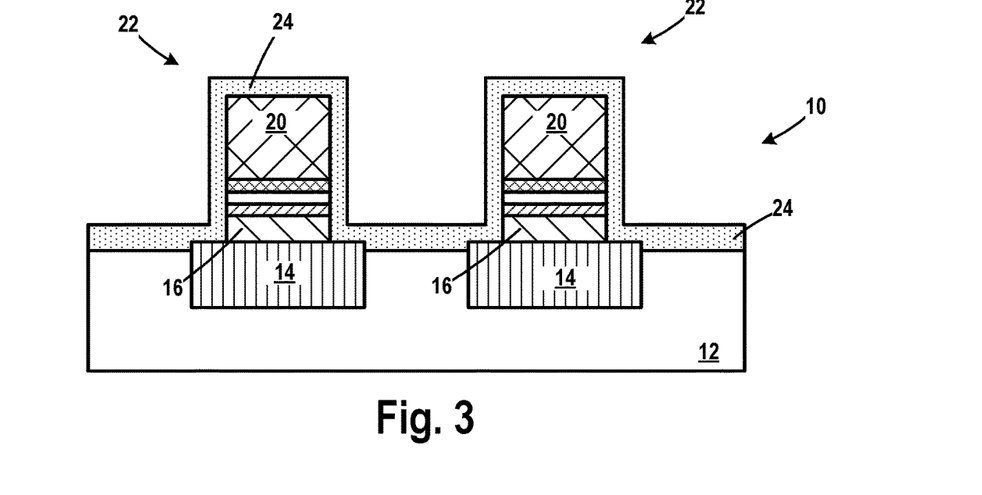

FIG. 3 depicts the product 10 after a deposition process, e.g., a conformal deposition process (e.g., CVD, PVD, ALD or IBD) was performed to form a conformal layer of insulating material 24 on and around the MRAM cells 22. The thickness and material of construction for the layer of insulating material 24 may vary depending upon the particular application. For example, the layer of insulating material 24 may be comprised of silicon dioxide, silicon nitride, nitrogen-doped silicon carbide, silicon oxynitride, silicon oxycarbide, silicon oxycarbide nitride, aluminum oxide, titanium oxide, tantalum oxide or a low-k material (k value of 8 or less), etc. In one illustrative embodiment, the conformal layer of insulating material 24 may be formed to a thickness of about 0.5-30 nm.

Figure 4:
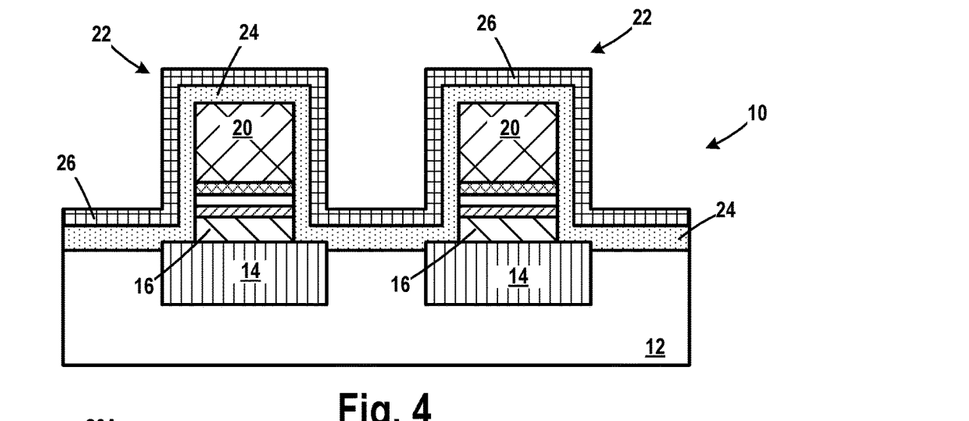

FIG. 4 depicts the product 10 after another deposition process, e.g., a conformal deposition process (e.g., PVD, CVD, ALD or IBD) was performed to form a conformal layer of a metal-containing shielding material 26 on the conformal layer of insulating material 24. The thickness and material of construction for the conformal layer of metal-containing shielding material 26 may vary depending upon the particular application. For example, the conformal layer of metal-containing shielding material 26 may be comprised of a substantially pure metal, a metal alloy, a metal-oxide, tungsten, tantalum, ruthenium, platinum, aluminum, etc. In one illustrative embodiment, such a layer of metal-containing shielding material 26 may comprise at least 30% metal (atomic percentage). In one illustrative embodiment, such a layer of metal-containing shielding material 26 may comprise enough metal such that the layer of metal-containing shielding material 26 constitutes an electrically conductive layer of material. In one illustrative embodiment, the conformal layer of metal-containing shielding material 26 may be formed to a thickness of about 0.5-30 nm.

Figure 5:
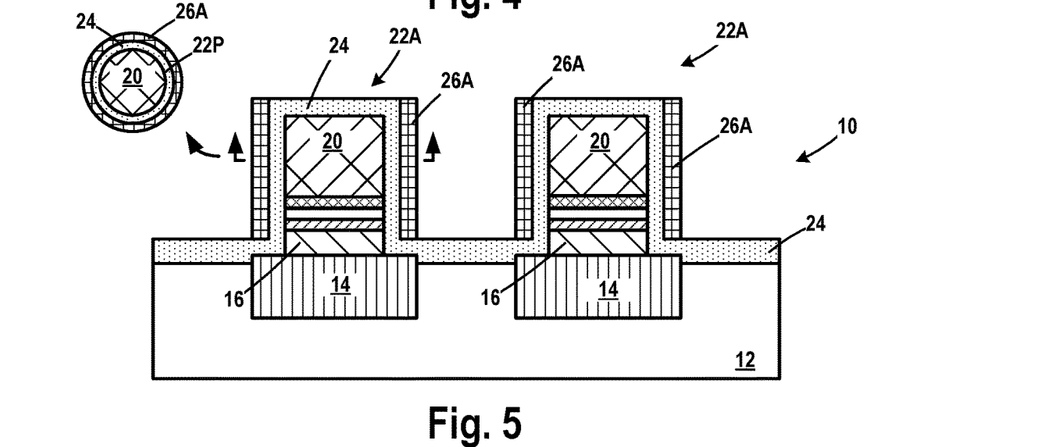

FIG. 5 depicts the product 10 after an anisotropic etching process was performed to remove portions of the conformal layer of metal-containing shielding material 26 relative to the conformal layer of insulating material 24. This results in the formation of a metal-containing shielding sidewall spacer 26A from the conformal layer of metal-containing shielding material 26. The metal-containing shielding sidewall spacer 26A extends around the entire perimeter 22P of each of the MRAM cells 22, as shown in the upper left of FIG. 5. The conformal layer of insulating material 24 is positioned laterally between the MRAM cell and the metal-containing shielding sidewall spacer 26A. As will be described more fully below, the metal-containing shielding sidewall spacer 26A constitutes a shield or at least a portion of a shield for at least one embodiment of the shielded MRAM cells 22A disclosed herein. In one illustrative embodiment, the metal-containing shielding sidewall spacer 26A may have a thickness (at its base) of about 0.5-30 nm.

Figure 6:
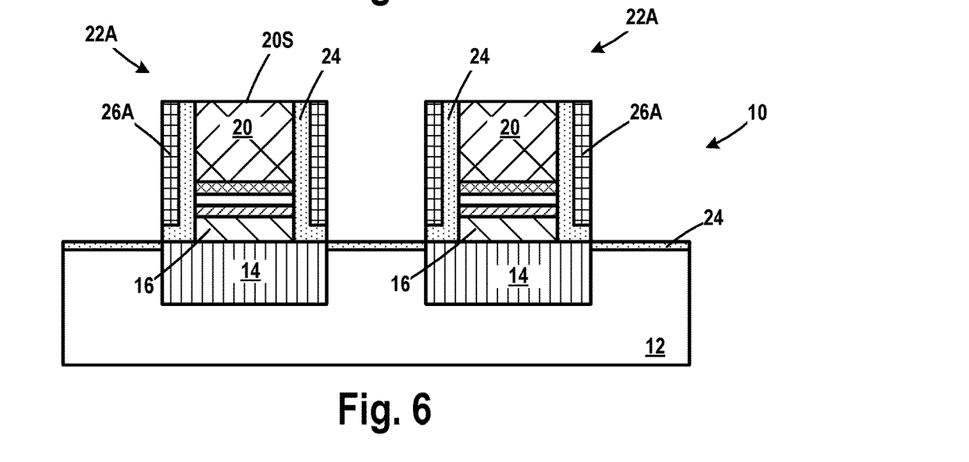

FIG. 6 depicts the product 10 after a timed, anisotropic etching process was performed to remove portions of the conformal layer of insulating material 24 relative to the surrounding materials. This results in the exposure of the upper surface 20S of the top electrode 20 of the shielded MRAM cells 22A. This anisotropic etching process may not need to be performed in all process flows, as the upper surface 20S of the top electrode 20 of the shielded MRAM cells 22A may be exposed by a later etching process, as discussed more fully below in connection with FIG. 8.

Figure 7:
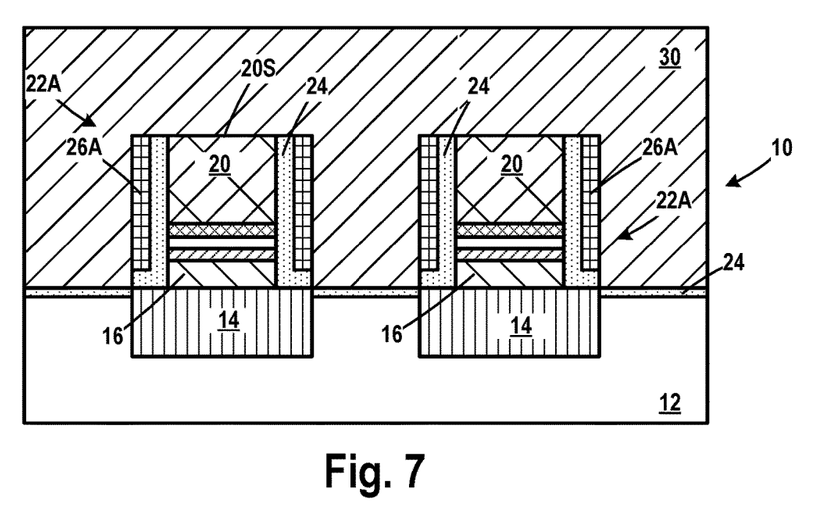

FIG. 7 depicts the product 10 after a layer of insulating material 30 (e.g., silicon dioxide, a low-k material) was blanket-deposited above the shielded MRAM cells 22A and after a CMP process was performed to planarize the upper surface of the layer of insulating material 30.

Figure 8:
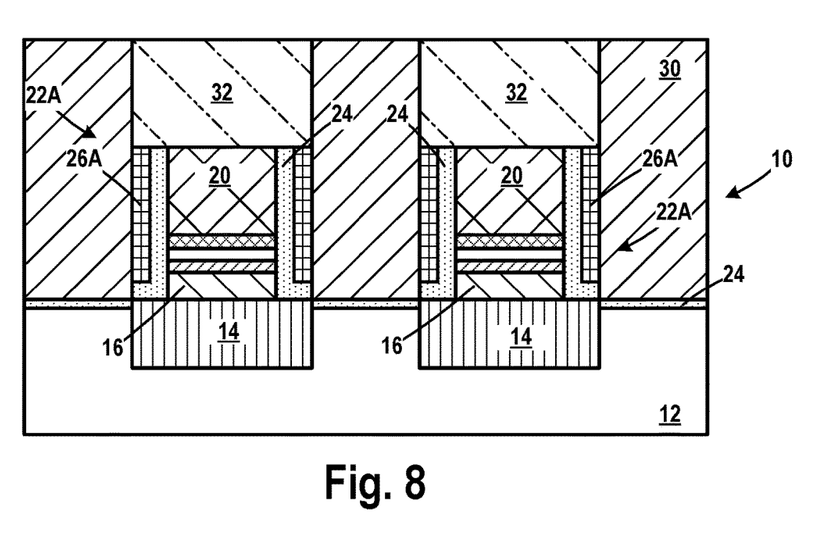

FIG. 8 depicts the product 10 after illustrative separate conductive contact structures 32 (e.g., conductive vias) were formed in the layer of insulating material 30 so as to conductively contact the top electrodes 20 of the shielded MRAM cells 22A. The conductive contact structures 32 may be comprised of any conductive material, they may be of any desired configuration, and they may be manufactured using any of a variety of different manufacturing techniques (e.g., single or dual damascene). As part of these process operations, contact openings would be formed in the layer of insulating material 30 above the top electrodes 20. If the insulating material 24 above the top electrodes 20 had not been previously removed, as described above with respect to FIG. 6, the insulating material 24 above the top electrodes 20 could be removed at this point in the process flow as well. Note that, in this illustrative embodiment, the metal-containing shielding sidewall spacer 26A is coupled to the conductive contact structure 32 and thus, the top electrode 20. However, in some cases, the metal-containing shielding sidewall spacer 26A may be electrically isolated from both the conductive contact structure 32 and the top electrode 20

Figure 9:
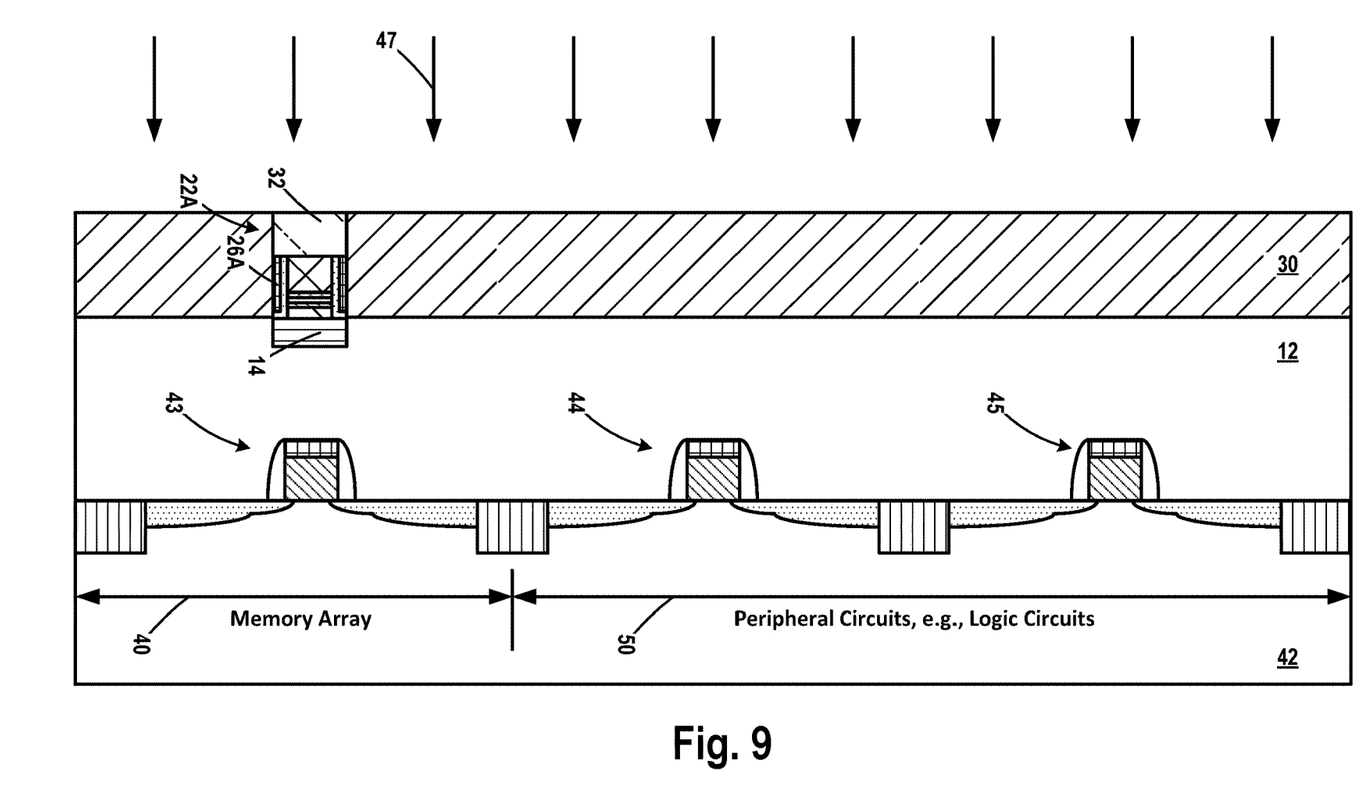

With reference to FIG. 9, and as noted above, in one illustrative embodiment, the shielded MRAM cells 22A disclosed herein may be part of an embedded MRAM array 40 that is formed on an IC product 10 comprised of a plurality of additional peripheral circuits 50, such as, for example, logic circuits. Accordingly, various illustrative and simplistically depicted transistors 43, 44 and 45 are fabricated in and above a semiconductor substrate 42. In one illustrative embodiment, the transistors 43, 44 and 45 may be CMOS-based devices, i.e., a plurality of NMOS and PMOS devices. The memory array 40 comprises a plurality of the illustrative shielded MRAM cells 22A disclosed herein (only one of which is depicted in FIG. 9). The transistor 43 may be an NMOS transistor that functions as a read switching element for the illustrative shielded MRAM cell 22A. Each of the shielded MRAM cells 22A in the memory array 40 would have a corresponding transistor 43. Various conductive lines and contact structures (not shown) would electrically couple portions of the shielded MRAM cell 22A to the transistor 43. The transistors 44 and 45 are CMOS-based transistors that are intended to be representative of any type of transistors that may be formed for any type of circuit. Various conductive lines and contact structures (not shown) would also be electrically coupled to the transistors 44 and 45 in the peripheral circuits.

At some point after completion of the fabrication of the transistor devices in the memory array 40 and in the peripheral circuit portion 50 of the product, and after completion of the formation of the shielded MRAM cells 22A for the memory array, the entire product 10 will be subjected to a silicon dangling bond passivation anneal process 47 so as to passivate dangling silicon bonds in the channel and/or source/drain regions of the transistor devices. In one illustrative example, the passivation anneal process is performed after all of the metal layers of the metallization system for the product have been formed, i.e., after all back-end-of-line processing activities have been completed. The presence of these dangling silicon bonds can reduce the performance of the transistor devices. Thus, in one illustrative embodiment, the anneal process 47 may be performed on the product at relatively elevated pressures and temperatures in an ambient comprising, for example, hydrogen ($H_2$) and deuterium ($D_2$) gases. During this silicon dangling bond passivation anneal process 47, atoms from the gases are released and bond with the dangling silicon bonds such that the formerly dangling silicon bonds are terminated by silicon-hydrogen bonds as well as silicon-deuterium bonds. The anneal process 47 may be performed using other gases as well, e.g., nitrogen, etc. The silicon dangling bond passivation anneal process 47 is somewhat directional (i.e., vertical in nature). The passivation anneal process 47 improves the operational characteristics and reliability of various transistor devices for all of the circuits formed above the substrate. However, the silicon dangling bond anneal process 47 damages several magnetic properties of non-shielded MRAM cells, which is detrimental to the performance of such non-shielded MRAM cells and memory arrays incorporating such non-shielded MRAM cells. Additionally, the improved performance and reliability of the transistors 43 in the memory array 40 as a result of performing the anneal process 47 does not significantly increase the operational performance of a memory array comprised of the non-shielded MRAM cells.

However, using the various novel embodiments of the shielded MRAM cells 22A disclosed herein for the memory array 40, the passivation anneal process 47 may be performed at some point after the formation of all of the transistor devices on the substrate 42 and after the formation of the shielded MRAM cells 22A for the memory array 40. In the example shown above, each of the shielded MRAM cells 22A comprises a metal-containing sidewall spacer 26A that forms a metal-containing shield around the entire perimeter of the shielded MRAM cell 22A, thereby at least reducing the ability of the diffusing atoms released during the passivation anneal process 47 to penetrate the shielded MRAM cells 22A. As noted above, depending upon the material selected for the metal-containing shielding material, the metal-containing sidewall spacer 26A may actually be an electrically conductive sidewall spacer 26A. Accordingly, the novel shielded MRAM cells 22A disclosed herein at least reduce, if not prevent, unacceptable levels of damage to the magnetic properties of the shielded MRAM cells 22A disclosed herein. The unique shielded MRAM cells 22A disclosed herein permit the above-described silicon dangling bond passivation anneal process 47 to be performed on an IC product 10 after the formation of the novel shielded MRAM cells 22A disclosed herein, thereby providing the desired increased performance and stability for the CMOS transistors formed in the various peripheral circuits of the product, while at the same time protecting the memory array from damage to the magnetic properties of the shielded MRAM cells 22A.

Figure 10:
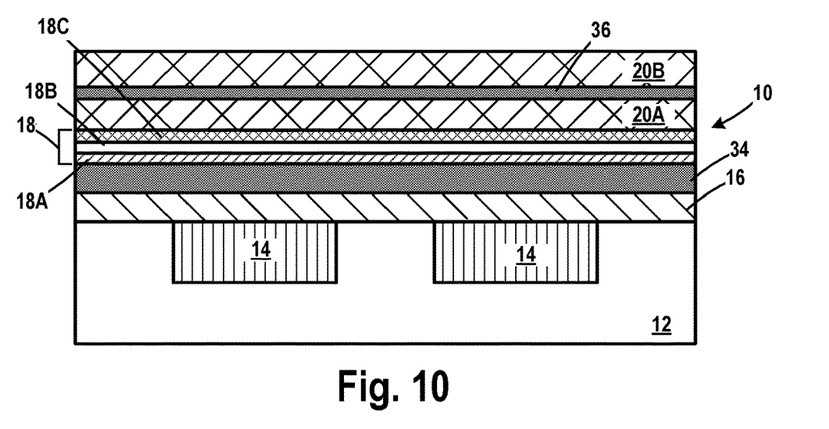
FIGS. 10-18 depict various other novel embodiments of a shielded MRAM cell and other novel methods of makings such shielded MRAM cells.

FIGS. 10-18 depict various other novel embodiments of a shielded MRAM cell and other novel methods of making such shielded MRAM cells. FIG. 10 depicts the IC product 10 at a point in processing that approximately corresponds to that shown in FIG. 1 above. However, relative to the embodiment shown in FIG. 1, in one illustrative embodiment, an electrically conductive bottom layer of metal-containing shielding material 34 was formed on or within the layer of bottom electrode material 16. Additionally, instead of the top electrode material layer 20 being a single layer of material (as shown in FIG. 1), in one illustrative embodiment, the top electrode is comprised of a lower layer 20A and an upper layer 20B, and an electrically conductive top layer of metal-containing shielding material 36 was formed between the lower layer 20A and upper layer 20B. In other embodiments, the top layer of metal-containing shielding material 36 may be formed on the top of a single layer of top electrode material, i.e., the top layer of metal-containing shielding material 36 could be positioned on top of what is labelled as the upper layer 20B in FIG. 10. In other embodiments, the top layer of metal-containing shielding material 36 may be formed on top of the MTJ element 18, and a single layer of top electrode material may thereafter be formed on top of the layer of metal-containing shielding material 36. As before, the various layers of material shown in FIG. 10 may be formed by sequentially blanket-depositing the materials above the layer of insulating material 12. The electrically conductive bottom and top layers of metal-containing shielding material 34, 36 may be formed to any desired thickness, and they both need not be formed to the same thickness, although that may be the situation in some applications.

The bottom and top layers of metal-containing shielding material 34, 36 may be formed of any metal-containing material, e.g., including the electrically conductive materials identified above for the conformal layer of metal-containing shielding material 26, and they need not be formed of the same metal-containing shielding material, but that may be the case in some applications. In one illustrative embodiment, one or both of the electrically conductive layers of metal-containing shielding material 34, 36 may comprise at least 30% metal (atomic percentage).

In one illustrative embodiment, the electrically conductive bottom and top layers of metal-containing shielding material 34, 36 may be comprised of W, Ru, Pt, Ta, Al, etc., and the bottom layer of metal-containing shielding material 34 may be formed to a greater thickness than that of the top layer of metal-containing shielding material 36. In some applications, the electrically conductive bottom and top layers of metal-containing shielding material 34, 36 may be made from materials that are different than the materials selected for the bottom electrode 16 and the lower and upper layers 20A, 20B. In other applications, one or more of the electrically conductive bottom and top layers of metal-containing shielding material 34, 36 may be made from materials that are different than the materials selected for the bottom electrode 16 and the lower and upper layers 20A, 20B. However, in this latter case, the electrically conductive bottom and top layers of metal-containing shielding material 34, 36 may be formed in such a manner so as to change one or more properties of the material for the bottom and top layers of metal-containing shielding material 34, 36 to make these layers more efficient and effective barriers, e.g., the shielding material may be formed in such a way so as to decrease the granular structure of the material as compared to the granular structure of the material used for the top and bottom electrodes.

Figure 11:
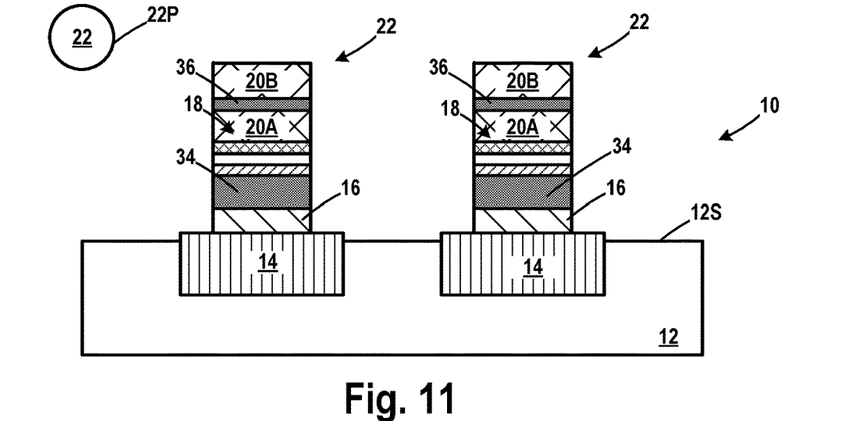

FIG. 11 depicts the product 10 after one or more etching processes, e.g., anisotropic etching processes, were performed through the above-described patterned etch mask (not shown) to etch the exposed portions of the layers 16, 34, 18A, 18B, 18C, 20A, 36 and 20B so as to result in the formation of a plurality of MRAM cells 22 (or pillars). There may be some pull-down of the upper surface 12S of the layer of insulating material 12 during this etching process, as reflected in FIG. 11. As before, in the examples depicted herein, the MRAM cells 22 will be patterned so as to have a substantially circular configuration when viewed from above, as indicated in the upper left portion of FIG. 11. The MRAM cells 22 have an outer perimeter 22P.

Figure 12:
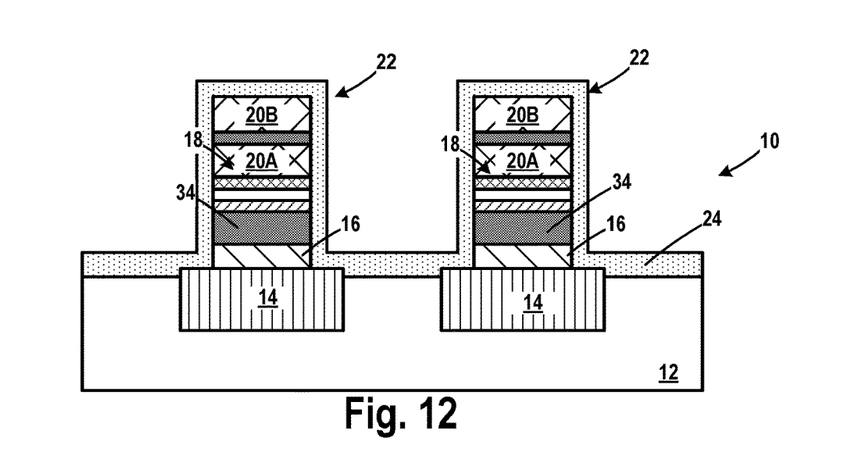

FIG. 12 depicts the product 10 after a deposition process, e.g., a conformal deposition process (e.g., PVD, CVD, ALD or IBD) was performed to form the above-described conformal layer of insulating material 24 on and around the MRAM cells 22.

Figure 13:
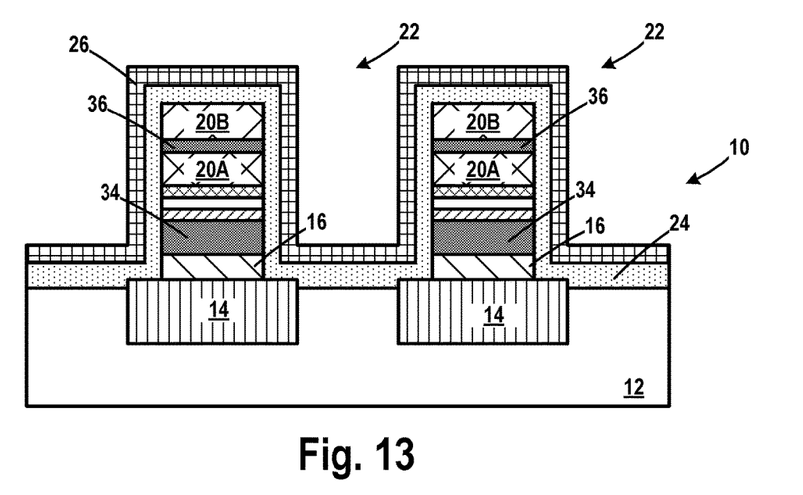

FIG. 13 depicts the product 10 after another deposition process, e.g., a conformal deposition process (e.g., PVD, CVD, ALD or IBD) was performed to form the above-described conformal layer of metal-containing shielding material 26 on the conformal layer of insulating material 24.

Figure 14:
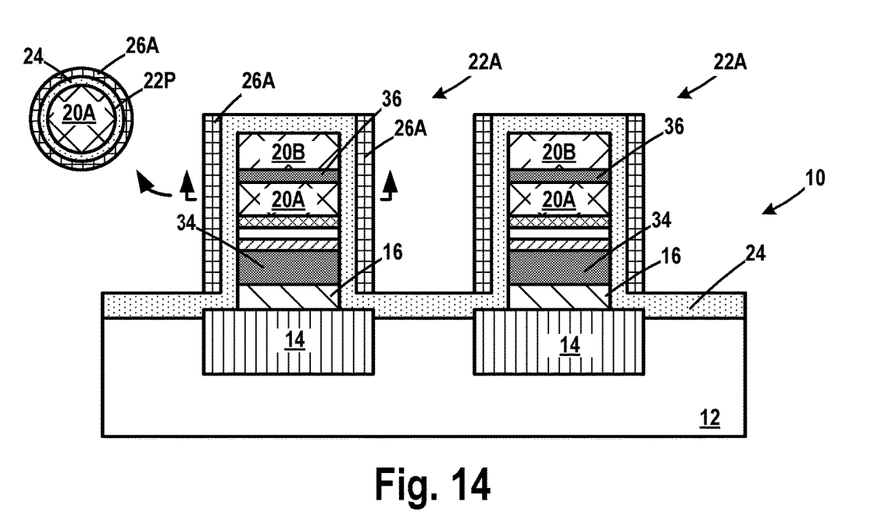

FIG. 14 depicts the product 10 after the above-described anisotropic etching process was performed to remove portions of the conformal layer of metal-containing shielding material 26 relative to the conformal layer of insulating material 24. As before, this results in the formation of a metal-containing shielding sidewall spacer 26A that extends around the perimeter 22P of each of the shielded MRAM cells 22A, as shown in the upper left of FIG. 14. The conformal layer of insulating material 24 is positioned laterally between the MRAM cell and the metal-containing shielding sidewall spacer 26A. The conformal layer of insulating material 24 is also positioned laterally between the bottom and top layers of metal-containing shielding material 34, 36 and the metal-containing shielding sidewall spacer 26A.

Figure 15:
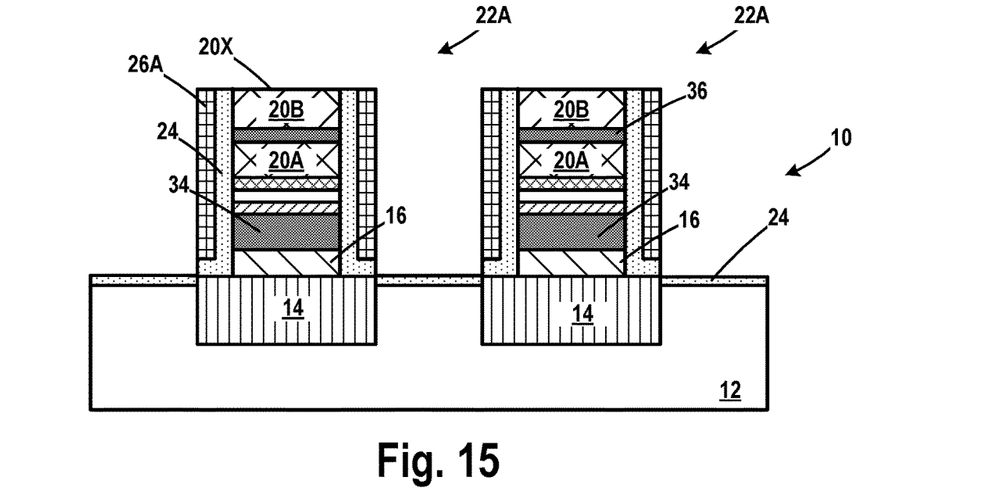

FIG. 15 depicts the product 10 after the above-described timed, anisotropic etching process was performed to remove portions of the conformal layer of insulating material 24 relative to the surrounding materials. This results in the exposure of the upper surface 20X of the upper layer 20B of the top electrode of the shielded MRAM cells 22A. Similar to the situation noted above, this anisotropic etching process may not need to be performed in all process flows, as the upper surface 20X of the upper layer 20B of the top electrode may be exposed by a later etching process, as discussed more fully below in connection with FIG. 16.

Figure 16:
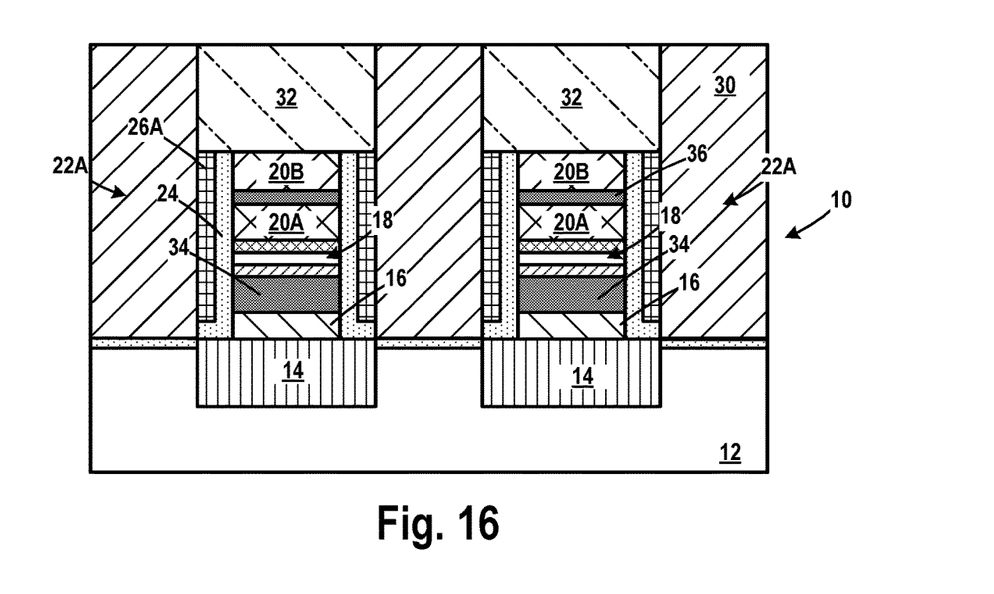

FIG. 16 depicts the product 10 after several process operations were performed. First, the above-described layer of insulating material 30 was formed above the shielded MRAM cells 22A. Next, a CMP process was performed to planarize the upper surface of the layer of insulating material 30. Then, the above-described conductive contact structures 32 (e.g., conductive vias) were formed in the layer of insulating material 30 so as to conductively contact the top electrodes of the shielded MRAM cells 22A. As part of these process operations, contact openings would be formed in the layer of insulating material 30 above the upper layer 20B of the top electrode. If the insulating material 24 above the upper surface 20X of the upper layer 20B of the top electrode had not been previously removed, as described above with respect to FIG. 15, the insulating material 24 above the upper layer 20B of the top electrode could be removed at this point in the process flow as well.

As will be appreciated by those skilled in the art after a complete reading of the present application, in the embodiment of the shielded MRAM cells 22A shown in FIG. 16, the MTJ element 18 is substantially encapsulated by metal-containing shielding material. That is, the side of the MTJ element 18 is shielded by the metal-containing shielding sidewall spacer 26A, the bottom of the MTJ element 18 is shielded by the bottom layer of metal-containing shielding material 34, and the top of the MTJ element 18 is shielded by the top layer of metal-containing shielding material 36. In this particular embodiment, the bottom and top layers of metal-containing shielding material 34, 36 do not extend to and contact the metal-containing shielding sidewall spacer 26A, as portions of the conformal layer of insulating material 24 are positioned between these components. Nevertheless, such an arrangement will be described herein and in the claims as an arrangement whereby the MTJ element 18 is substantially encapsulated with metal-containing shielding material. This metal-containing shielding arrangement provides a means by which to reduce or prevent the degradation of the magnetic properties of the MTJ element 18 of the shielded MRAM cells 22A disclosed herein as a result of performing the above-described silicon dangling bond passivation anneal process 47. As noted above, depending upon the material selected for the metal-containing shielding material 26, the MTJ element 18 may be substantially encapsulated by electrically conductive materials.

Figure 17:
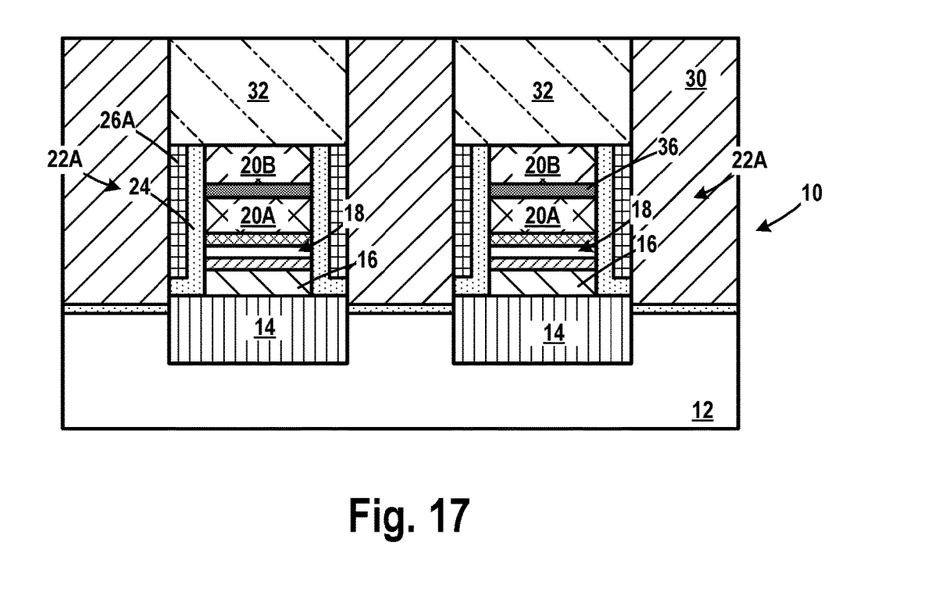

As will be appreciated by those skilled in the art after a compete reading of the present application, there are several other possible embodiments of the novel shielded MRAM cells 22A disclosed herein. For example, FIG. 17 depicts an embodiment wherein the shielded MRAM cells 22A are shielded only by the top layer of metal-containing shielding material 36 and the metal-containing shielding sidewall spacer 26A. This embodiment may be formed by omitting the formation of the bottom layer of metal-containing shielding material 34. This metal-containing shielding arrangement provides a means by which to reduce or prevent the degradation of the magnetic properties of the MTJ element 18 of the shielded MRAM cells 22A disclosed herein as a result of performing the above-described silicon dangling bond passivation anneal process 47.

Figure 18:
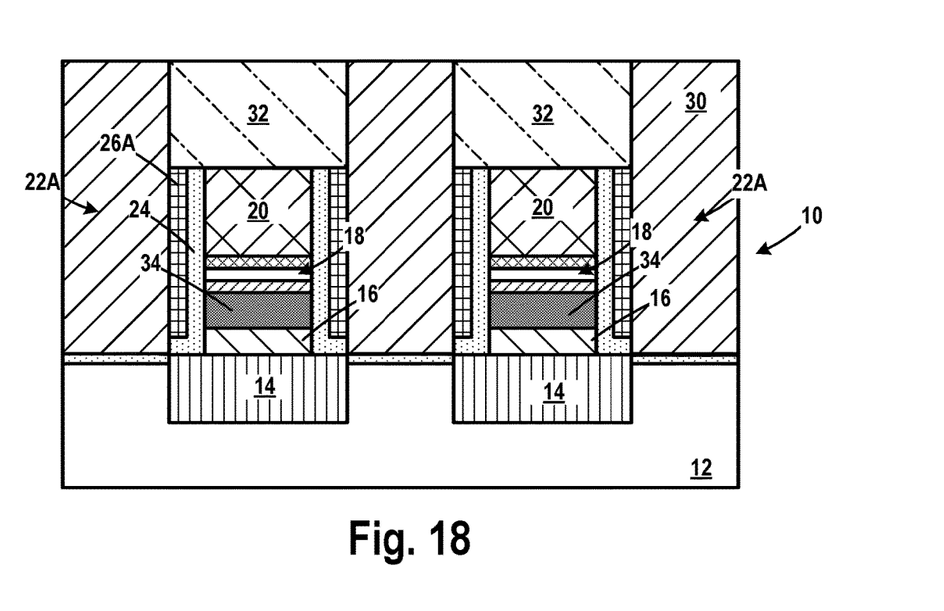

FIG. 18 depicts an embodiment wherein the shielded MRAM cells 22A are shielded only by the bottom layer of metal-containing shielding material 34 and the metal-containing shielding sidewall spacer 26A. This embodiment may be formed by omitting the formation of the top layer of metal-containing shielding material 36. This metal-containing shielding arrangement also provides a means by which to reduce or prevent the degradation of the magnetic properties of the MTJ element 18 of the shielded MRAM cells 22A disclosed herein as a result of performing the above-described silicon dangling bond passivation anneal process 47.

Figure 19:
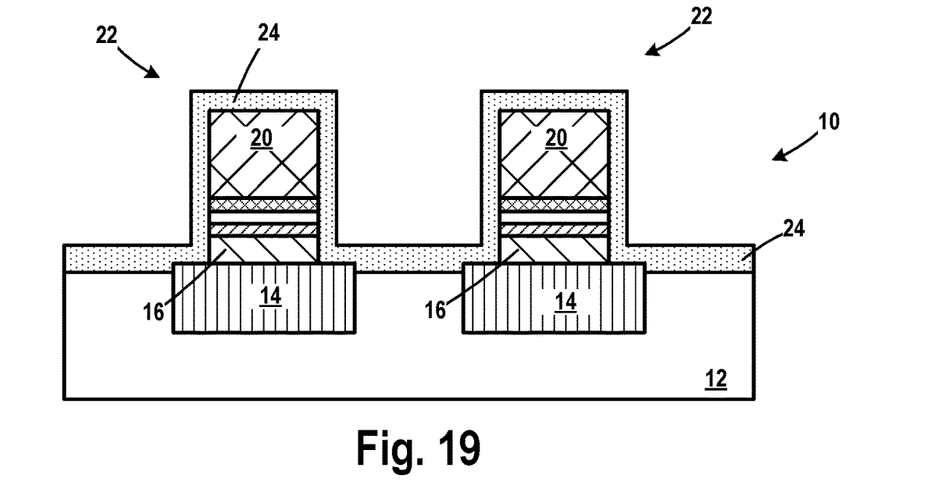
FIGS. 19-24 depict yet other novel embodiments of a shielded MRAM cell and novel methods of makings such shielded MRAM cells.

FIGS. 19-24 depict yet other novel embodiments of a shielded MRAM cell and novel methods of making such shielded MRAM cells. FIG. 19 depicts the IC product 10 at a point in processing that approximately corresponds to that shown in FIG. 3 above, i.e., after the formation of the above-described conformal layer of insulating material 24 on and around the MRAM cells 22.

Figure 20:
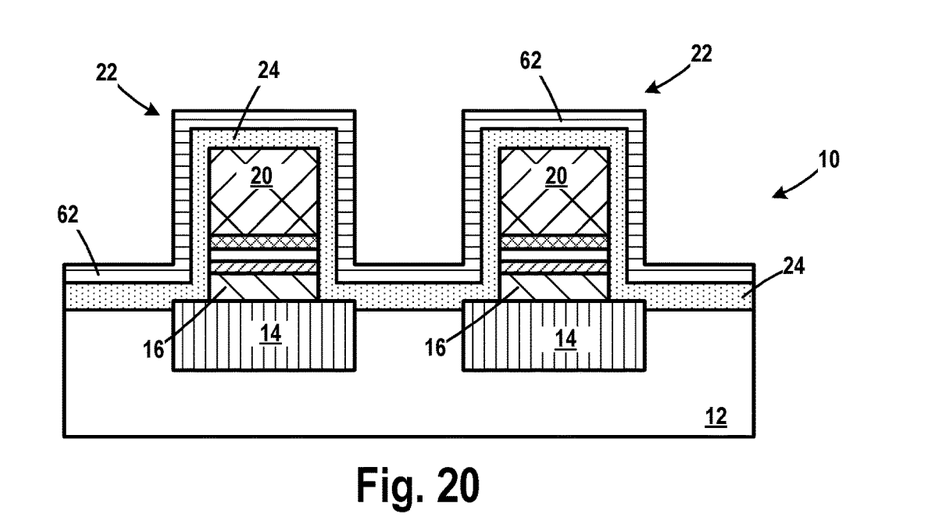

FIG. 20 depicts the product 10 after another conformal deposition process (e.g., PVD, CVD, ALD or IBD) was performed to form a second conformal layer of a shielding insulating material 62 on the conformal layer of insulating material 24 and around the MRAM cells 22. The thickness and material of construction for the layer of shielding insulating material 62 may vary depending upon the particular application. For example, the layer of shielding insulating material 62 may be comprised of silicon dioxide, silicon nitride, nitrogen-doped silicon carbide, silicon oxynitride, silicon oxycarbide, silicon oxycarbide nitride, aluminum oxide, titanium oxide, tantalum oxide or a low-k material (k value of 8 or less), etc. In one illustrative embodiment, the conformal layer of shielding insulating material 62 may be formed to a thickness of about 0.5-30 nm. In one particularly illustrative example, the layer of insulating material 24 may be comprised of silicon nitride and the layer of shielding insulating material 62 may be comprised of aluminum oxide. The formation of the dual layers of shielding insulating materials on the sidewalls of the shielded MRAM cells 22A provides additional protection for the MTJ elements of the shielded MRAM cells 22A during the anneal process 47 described above. In one embodiment, the first and second insulating materials 24 and 62 have a lateral thickness at a location adjacent a mid-height of the MRAM cell 22 that falls within the range of about 0.5-30 nm.

Figure 21:
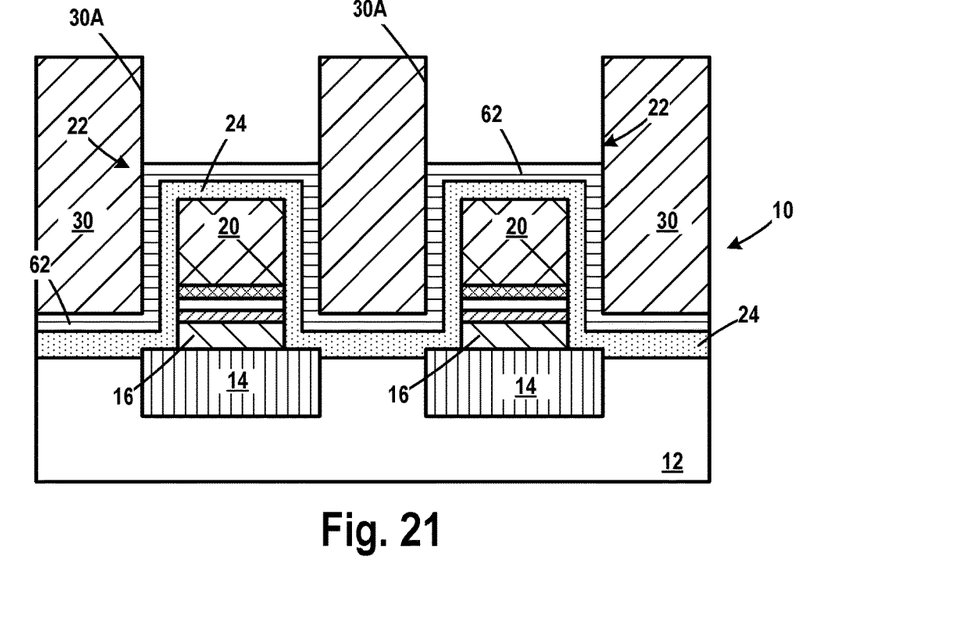

FIG. 21 depicts the product 10 after several process operations were performed. First, the above-described layer of insulating material 30 was formed above the MRAM cells 22. Next, a CMP process was performed to planarize the upper surface of the layer of insulating material 30. Then, various contact openings 30A were formed in the layer of insulating material 30 above the top electrodes 20. This process operation exposes the conformal layer of insulating material 62. The openings 30A may be formed by forming a patterned etch mask (not shown) above the layer of insulating material 30 and thereafter performing an etching process through the patterned etch mask.

Figure 22:
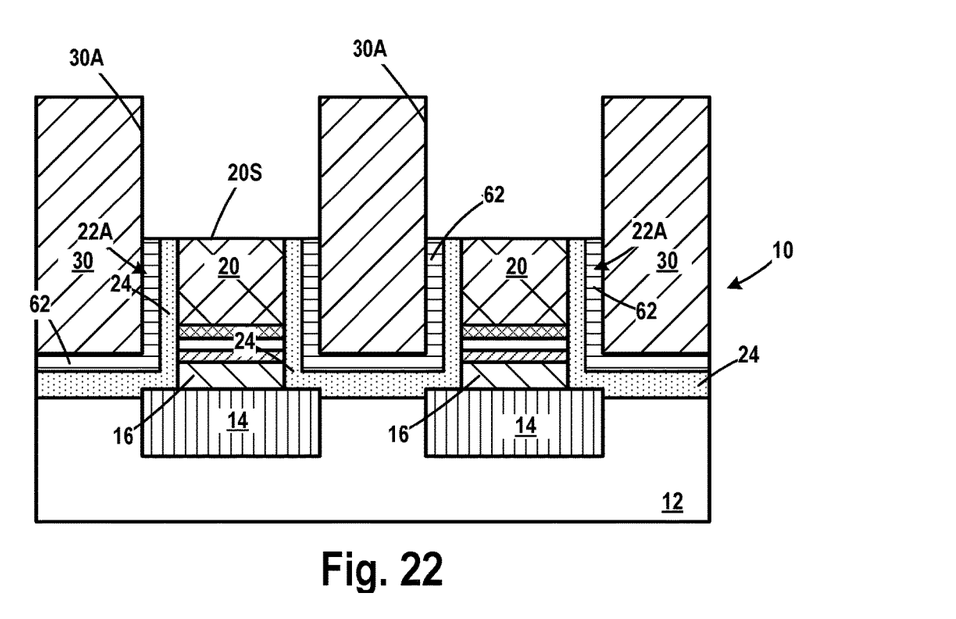

FIG. 22 depicts the product 10 after one or more etching processes were performed to remove the portions of the layer of shielding insulating material 62 and the layer of insulating material 24 positioned below the openings 30A. These process operations expose the upper surface 20S of the top electrodes 20 of the shielded MRAM cells 22A. Note that this process operation results in the formation of U-shaped layers of insulating material 24 and 62 positioned between adjacent shielded MRAM cells 22A (when viewed in the cross-section shown in FIG. 22). The formation of the two layers of insulating material 24 and 62 around the perimeter of initial MRAM cells 22A provides for reliable means of providing the desired protection of the MTJ element 18 during the above-described anneal process 47.

Figure 23:
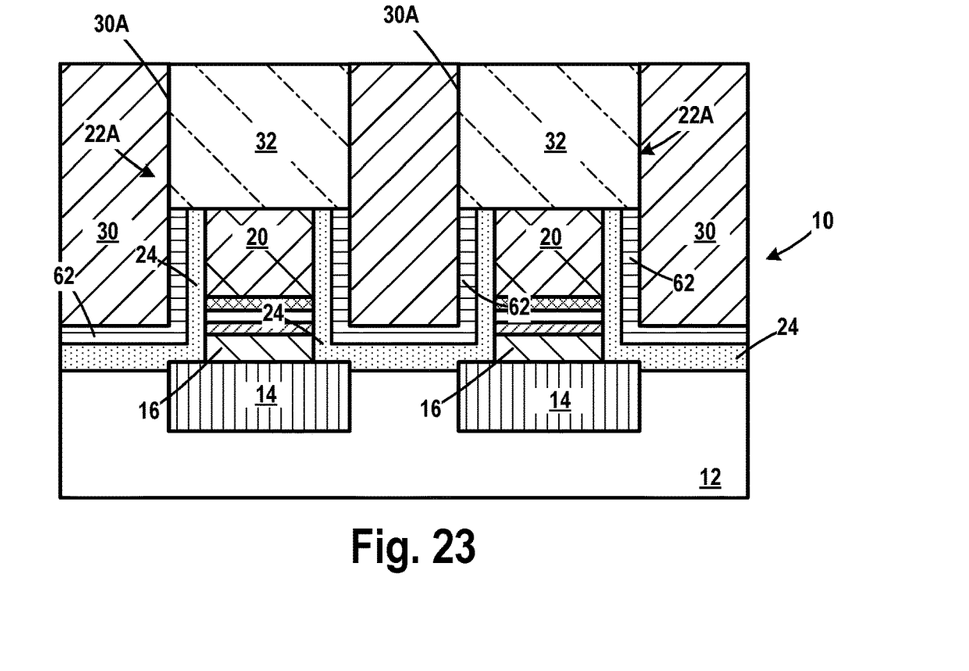

FIG. 23 depicts the product 10 after the above-described conductive contact structures 32 (e.g., conductive vias) were formed in openings 30A in the layer of insulating material 30 so as to conductively contact the top electrodes 20 of the shielded MRAM cells 22A. The conductive contact structures 32 may be comprised of any conductive material, they may be of any desired configuration, and they may be manufactured using any of a variety of different manufacturing techniques (e.g., single or dual damascene). In this embodiment, the shielding of the shielded MRAM cells 22A is provided by forming the layer 62 from a non-conductive material, e.g., silicon dioxide, silicon nitride, etc. In this particular example, it should also be noted that the layers 62 and 24 take the form of conformal layers of insulating material. More specifically, the substantially horizontally oriented portion of the conformal layer of insulating material 24 extends laterally between the adjacent MRAM cells 22A, and the substantially horizontally oriented portion of the conformal layer of shielding insulating material 62 extends laterally between the MRAM cell and an adjacent MRAM cell and is positioned vertically above the horizontally oriented portion of the conformal layer of the insulating material 24.

Figure 24:
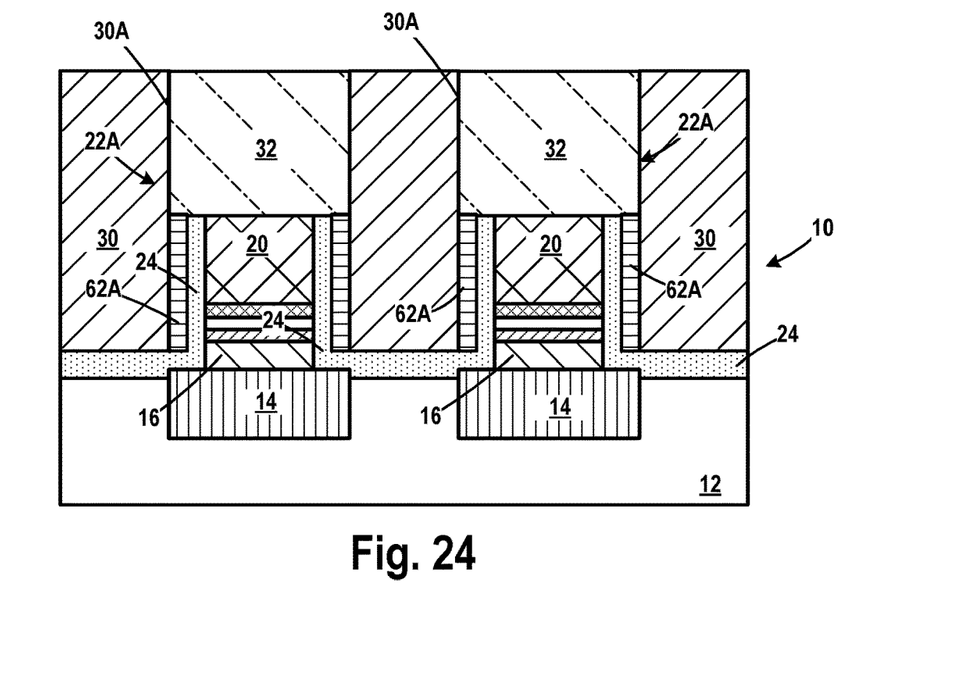

FIG. 24 depicts an embodiment wherein, after the formation of the above-described layer of shielding insulating material 62 (as shown in FIG. 20), an anisotropic etching process was performed to remove substantially horizontally oriented portions of the conformal layer of shielding insulating material 62 relative to the conformal layer of insulating material 24. This results in the formation of an insulating shielding sidewall spacer 62A from the layer of shielding insulating material 62. The insulating shielding sidewall spacer 62A extends around the entire perimeter 22P of each of the MRAM cells 22. The insulating shielding sidewall spacer 62A has a thickness, at its base, of about 0.5-30 nm. Note that, in this embodiment, shielding insulating material 62 is not present above at least some part of the conformal layer of insulating material 24 that extends laterally between the MRAM cells 22A. After the formation of the insulating shielding sidewall spacer 62A, processing of the product may continue with the steps shown in FIG. 21 and thereafter.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   an MRAM cell, said MRAM cell having an outer perimeter, said MRAM cell comprising:
   a bottom electrode;
   a top electrode; and
   an MTJ (Magnetic Tunnel Junction) element positioned above said bottom electrode and below said top electrode;
   an insulating material positioned around said outer perimeter of said MRAM cell;
   an electrically conductive top layer of a metal-containing shielding material positioned above said MJT element; and
   a metal-containing sidewall spacer comprised of a metal-containing shielding material positioned around said outer perimeter of said MRAM cell, wherein said insulating material is positioned between said metal-containing sidewall spacer and said MRAM cell, wherein said insulating material is positioned laterally between said metal-containing sidewall spacer and said MTJ element and covers vertical sidewall portions of said electrically conductive top layer of metal-containing shielding material.

2. The integrated circuit product of claim 1, wherein said top electrode comprises a lower layer and an upper layer and wherein said electrically conductive top layer of a metal-containing shielding material is positioned above said lower layer and below said upper layer.

3. The integrated circuit product of claim 2, further comprising an electrically conductive bottom layer of a metal-containing shielding material positioned below said MTJ element and above said bottom electrode, wherein said insulating material covers vertical sidewall portions of said electrically conductive bottom layer of metal-containing shielding material.

4. The integrated circuit product of claim 3, wherein said metal-containing sidewall spacer, said electrically conductive top layer of metal-containing shielding material and said electrically conductive bottom layer of metal-containing shielding material all comprise a same metal-containing shielding material.

5. The integrated circuit product of claim 3, wherein said metal-containing sidewall spacer, said electrically conductive top layer of metal-containing shielding material and said electrically conductive bottom layer of metal-containing shielding material, considered collectively, substantially encapsulate said MRAM cell.

6. The integrated circuit product of claim 5, wherein said metal-containing sidewall spacer is an electrically conductive sidewall spacer.

7. The integrated circuit product of claim 3, wherein said insulating material is positioned laterally between said metal-containing sidewall spacer and each of said MTJ element, said electrically conductive top layer of metal-containing shielding material and said electrically conductive bottom layer of metal-containing shielding material.

8. The integrated circuit product of claim 1, further comprising an electrically conductive bottom layer of a metal-containing shielding material positioned below said MTJ element and above said bottom electrode, wherein said insulating material covers vertical sidewall portions of said electrically conductive bottom layer of metal-containing shielding material.

9. The integrated circuit product of claim 1, wherein said metal-containing shielding material comprises one of a substantially pure metal, metal alloy, tungsten, tantalum, ruthenium, aluminum or platinum and wherein said metal-containing sidewall spacer has a thickness, at its base, of about 0.5-30 nm.

10. The integrated circuit product of claim 1, wherein said metal-containing sidewall spacer comprises at least 30% metal (atomic percentage).

11. The integrated circuit product of claim 1, wherein said metal-containing sidewall spacer is an electrically conductive sidewall spacer.

12. An integrated circuit product, comprising:
an MRAM cell, said MRAM cell having an outer perimeter, said MRAM cell comprising:
a bottom electrode;
a top electrode; and
an MTJ (Magnetic Tunnel Junction) element positioned above said bottom electrode and below said top electrode;
a conformal layer of first insulating material positioned around said outer perimeter of said MRAM cell; and
a second shielding insulating material positioned on said first insulating material and around said outer perimeter of said MRAM cell, wherein said first insulating material and said second shielding insulating material are different materials and said second shielding insulating material is in the form of an insulating shielding sidewall spacer comprised of said second shielding insulating material positioned vertically above a portion of said conformal layer of said first insulating material and is not present above at least some part of said conformal layer of said first insulating material that extends laterally between said MRAM cell and an adjacent MRAM cell.

13. The integrated circuit product of claim 12, wherein said first insulating material comprises one of silicon dioxide, silicon nitride, nitrogen-doped silicon carbide, silicon oxynitride, silicon oxycarbide, silicon oxycarbide nitride, aluminum oxide, titanium oxide, tantalum oxide or a low-k material (k value of 8 or less) and said second shielding insulating material comprises one of silicon dioxide, silicon nitride, nitrogen-doped silicon carbide, silicon oxynitride, silicon oxycarbide, silicon oxycarbide nitride, aluminum oxide, titanium oxide, tantalum oxide or a low-k material (k value of 8 or less).

14. The integrated circuit product of claim 12, wherein said first insulating material is in the form of a conformal layer of said first insulating material, wherein a substantially horizontally oriented portion of said conformal layer of said first insulating material extends laterally between said MRAM cell and an adjacent MUM cell.

15. The integrated circuit product of claim 14, wherein each of said first insulating material and said second shielding insulating material have a lateral thickness at a location adjacent a mid-height of said MRAM cell that falls within a range of about 0.5-30 nm.

16. The integrated circuit product of claim 14, wherein said insulating shielding sidewall spacer has a thickness, at its base, of about 0.5-30 nm.

17. The integrated circuit product of claim 12, wherein said MRAM cell has a generally circular configuration when viewed from above and wherein said integrated circuit product further comprises a plurality of CMOS-based transistor devices that are formed for at least one non-memory circuit on said integrated circuit product.

* * * * *

UNITED STATES PATENT AND TRADEMARK OFFICE
CERTIFICATE OF CORRECTION

PATENT NO. : 10,439,129 B2
APPLICATION NO. : 15/874077
DATED : October 8, 2019
INVENTOR(S) : Dimitri Houssameddine et al.

Page 1 of 1

It is certified that error appears in the above-identified patent and that said Letters Patent is hereby corrected as shown below:

In the Claims

Column 14, Line 20 (Claim 14, Line 6), change "MUM" to -- MRAM --.

Signed and Sealed this
Nineteenth Day of November, 2019

Andrei Iancu
*Director of the United States Patent and Trademark Office*